United States Patent [19]

Luciw

[11] 4,441,168
[45] Apr. 3, 1984

[54] STORAGE LOGIC/ARRAY (SLA) CIRCUIT
[75] Inventor: Wolodymyr Luciw, Norristown, Pa.
[73] Assignee: Sperry Corporation, New York, N.Y.
[21] Appl. No.: 339,022
[22] Filed: Jan. 13, 1982
[51] Int. Cl.³ .............................................. G11C 11/40
[52] U.S. Cl. ..................................... 365/154; 365/190
[58] Field of Search ............... 365/104, 154, 156, 190, 365/202

[56] References Cited
U.S. PATENT DOCUMENTS
3,968,480 7/1976 Stein ..................................... 365/154
4,099,265 7/1978 Abe ...................................... 365/154

Primary Examiner—Joseph A. Popek
Attorney, Agent, or Firm—James R. Bell; Marshall M. Truex

[57] ABSTRACT

A simplified storage logic array (SLA) circuit is disclosed. A pair of oppositely directed inverter circuits is connected between two column leads. The signal present on one lead is the complement of the other. Row circuits are provided for connection with the column leads which cause the state of the signals to change logic state in accordance with the connections between the row circuits and the column leads.

6 Claims, 5 Drawing Figures

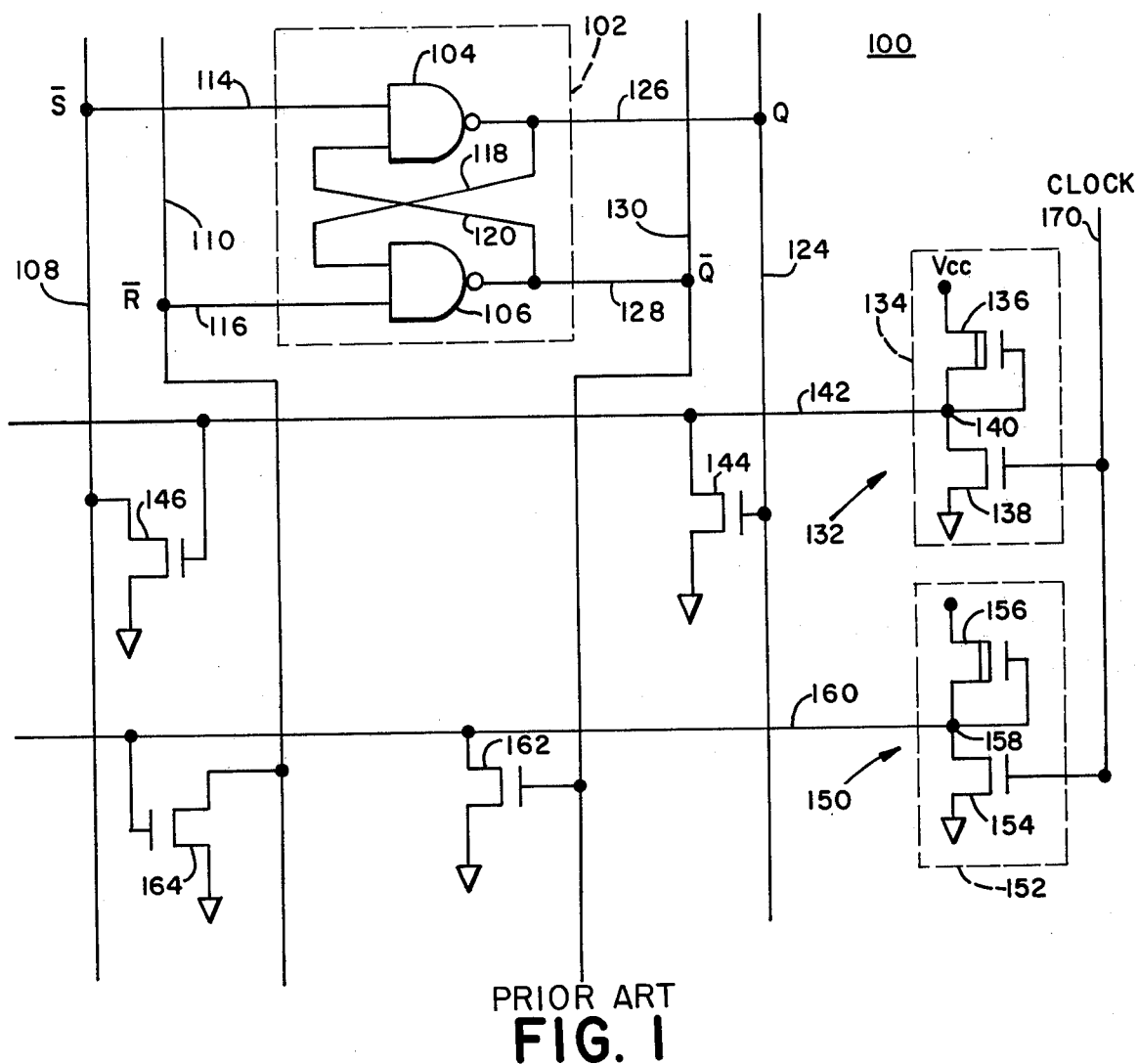
PRIOR ART
FIG. 1
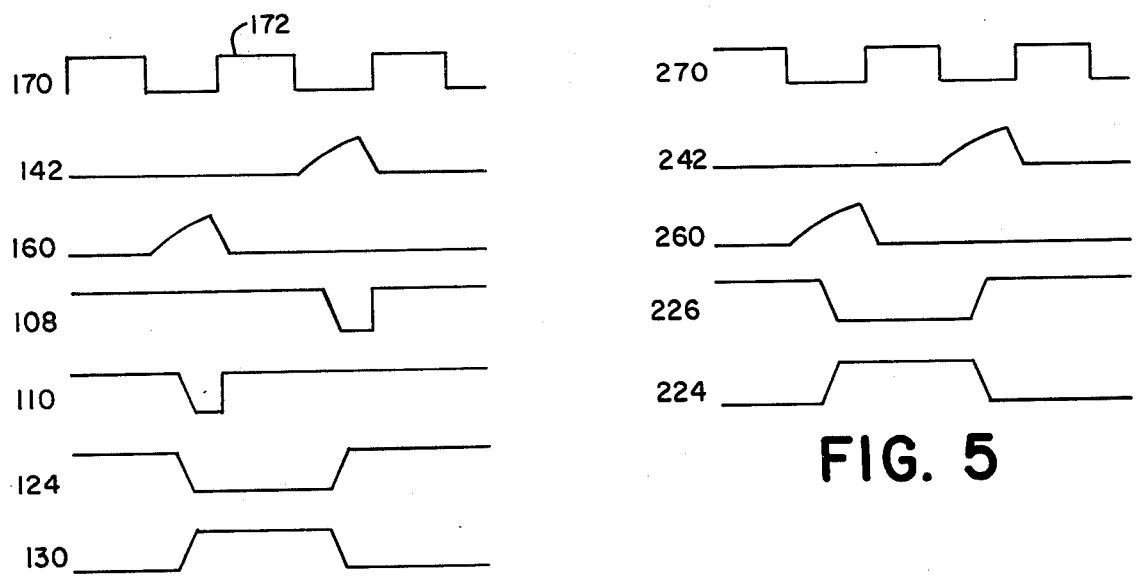
FIG. 4
FIG. 5

STORAGE LOGIC/ARRAY (SLA) CIRCUIT

BACKGROUND OF THE INVENTION

The present invention relates to an improved storage logic array (SLA) circuit wherein the storage element is simplified resulting in a higher density SLA circuit chip.

There is much interest today in implementing custom or semi-custom digital circuit devices in a large scale or a very large scale integrated chip using a regular logic array structure. One such regular logic array structure is a programmable logic array (PLA) comprising, for example, a plurality of column input leads and a plurality of row output leads. The column leads carry a plurality of input signals and their complements. Any combination of the input leads can be coupled to the plurality of row output leads to form a number of conjugate terms (by providing a number of coupled column and row leads to an AND gate). The conjugate terms are then provided to OR gates to provide the output signals.

In some PLA's flip-flops have been added to the circuit to provide feedback from the outputs to the inputs. This provides increased range of application for the PLA but most PLA's suffer from inefficient utilization of the chip area within the AND and OR arrays because only a small fraction of available logic elements on the chip are actually used in typical designs.

One of the more powerful and interesting regular logic arrays, called storage logic arrays (SLA), is described in detail in an article in the IEEE Transactions on Computers entitled, "A Programmable Logic Approach for VLSI", by Suhas S. Patil and Terry A. Welch, Vol. C-28, No. 9, Sept. 1979, pages 594–601, hereby incorporated by reference as if specifically set forth herein. A SLA chip comprises a plurality of logical column circuits, each column circuit including: a storage cell, such as a set, reset flip-flop in the form of cross coupled logic gates; and four column leads disposed to be coupled to or to be decoupled from the flip-flop. The SLA chip further comprises a plurality of row circuits crossing over the logical column circuits, each row circuit disposed to be coupled to or decoupled from the input and output leads of each logical column circuit. Two of the column leads provide the set and reset commands, and the remaining two provide the Q and $\overline{Q}$ outputs. The set, reset flip-flop also requires the use of at least sic transistors for implementation. It is desirable to reduce the area of a chip used by the SLA circuit since, generally, with integrated circuits, smaller is better.

SUMMARY OF THE INVENTION

It is an object of the present invention to provide a storage/logic array (SLA) having less complexity than prior art storage/logic arrays.

It is a further object of the present invention to provide a simplified design for an SLA circuit wherein the layout and interconnections required of the SLA are simplified.

Another object of the present invention is to provide a storage/logic array circuit having at least one storage cell having only two terminals.

In the present invention, a pair of oppositely directed inverter circuits are used to replace a more complicated set, rest flip-flop as the storage cell in a SLA circuit. The inverter pair requires only a single pair of column leads for operation. The circuits are simpler to lay out and require less area than conventional set, reset flip-flops and only two column leads are required instead of four.

BRIEF DESCRIPTION OF THE DRAWINGS

FIG. 1 is a block diagram schematic of a prior art storage logic array (SLA) circuit.

FIG. 4 is a waveform illustration of the timing signals used in connection with the schematic of FIG. 1.

FIG. 5 is a waveform illustration of the timing signals used in connection with the schematic of FIG. 2.

DETAILED DESCRIPTION OF THE INVENTION

Figure 2:
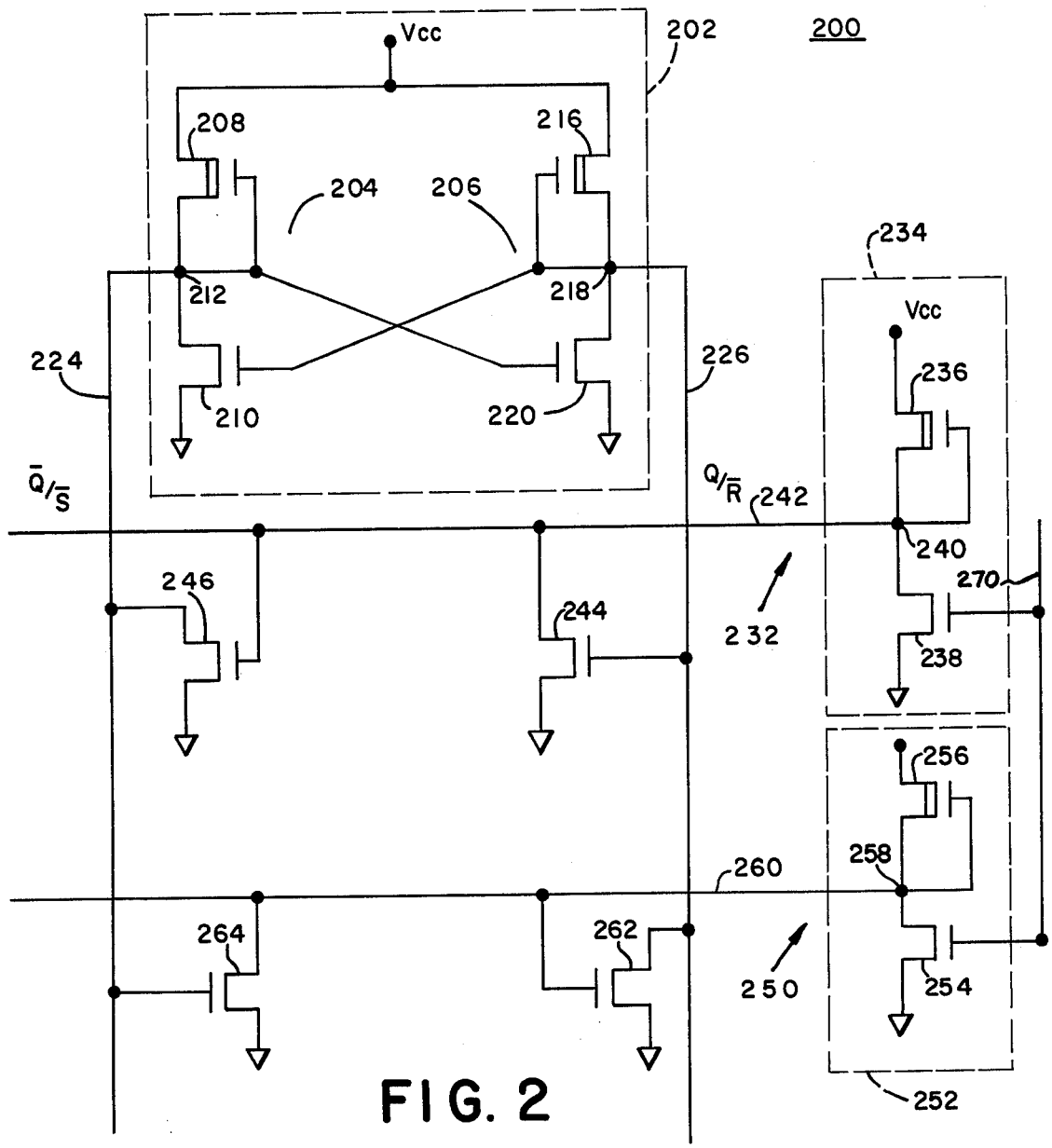
FIG. 2 is a circuit schematic of the preferred embodiment of the present invention SLA circuit.

Referring now to FIG. 1, a block diagram of a prior art storage/logic array (SLA) circuit designated generally 100 is shown comprising a set, reset flip-flop 102 for storing a set or reset state, the flip-flop shown being assembled from cross coupled NAND gates 104 and 106 in a conventional manner. The circuit 100 further comprises set ($\overline{S}$) and reset ($\overline{R}$) column input leads 108 and 110 respectively. The $\overline{S}$ lead 108 is connected as an input to NAND gate 104 via lead 114, while $\overline{R}$ lead 110 is connected via lead 116 to NAND gate 106. The output of NAND gate 104 via lead 118 serves as the second input to NAND gate 106, while the output of the NAND gate 106 via lead 120 is connected to the second input of NAND gate 104.

The circuit 100 further comprises the Q and $\overline{Q}$ output column leads 124 and 130, respectively. The Q output of flip-flop 102 from NAND gate 104 is connected to column output lead 124 via lead 126 while the $\overline{Q}$ output of NAND gate 106 is connected via lead 128 to column lead 130. Together the flip-flop 102, acting as a storage cell, and the column leads 108, 110, 124 and 130 comprise a column circuit.

The SLA circuit of FIG. 1 further includes a first row circuit designated generally 132 comprising an input inverter 134 implemented with metal oxide semiconductor (MOS) transistor 136 and 138. MOS transistor 136 is a depletion type transistor, while transistor 138 is an enhancement type transistor. A depletion type MOS transistor will conduct when the gate to source voltage is approximately zero volts. An enhancement type MOS transistor requires the gate to source voltage to be biased either positively or negatively, depending on whether the transistor is N type or P type before the transistor will conduct. Transistor 138 is connected to transistor 136 at junction 140.

The junction 140 represents the output terminal of inverter circuit 134 and is connected to row lead 142. The first row circuit 132 further comprises MOS transistors 144 and 146. Transistor 144 is connected between row lead 142 and ground and its gate is connected to the Q column lead 124. Transistor 146 is connected between the $\overline{S}$ column lead 108 and ground and its gate is connected to row lead 142.

The SLA circuit of FIG. 1 further includes a second row circuit 150 similar to circuit 132. It includes an inverter input circuit 152 with MOS transistors 154 and 156 connected together at junction 158. Junction 158 is the output junction and is connected to row lead 160.

The second row circuit further comprises MOS transistor 162 connected between row line 160 and ground with its gate connected to $\overline{Q}$ column line 130, and MOS transistor 164 connected between the $\overline{R}$ column line 110 and ground with its gate connected to row lead 160.

The gates of lower transistors 138 and 154 of circuits 134 and 152, respectively, are connected to lead 170, while the gates of transistors 136 and 156 are connected to row leads 142 and 160, respectively. The SLA circuit of FIG. 1 shows only two row circuits connected to the column leads 108, 110, 130 and 124. However, in general any number of row circuits can be connected between the column lines in an SLA chip having a plurality of SLA circuits 100. The particular connection of row and column leads described by transistors 144, 146, 162 and 164 are but one example of how the column leads are connected to the row leads. In general, it is not necessary that all of the SLA circuits have their column leads connected to row leads as shown in FIG. 1.

A description of the operation of the above circuit is aided by reference to the waveform illustrations of FIG. 4. Initially, it is assumed that the Q column lead 124 is high and the $\overline{Q}$ lead 130 is low. A series of clock pulses 172 are transmitted to the inverter circuits 134 and 152 via lead 170. A high clock pulse applied to the gates of transistors 138 and 154 turns the transistors on, pulling the leads 142 and 160 low. This disables transistors 146 and 164 and the flip-flop 102 maintains its existing state during the high clock signal. When the clock goes low, transistors 138 and 154 are turned off allowing leads 142 and 160 to be pulled high by action of the depletion transistors 136 and 156, respectively. However, the signal on the Q column lead 124 is high which turns on transistor 144 clamping lead 142 low. This turns off transistor 146. However, the low signal on the $\overline{Q}$ column lead 130 is low disabling transistor 12. Lead 160 is pulled high turning on transistor 164 and pulling the $\overline{R}$ column lead 110 low. This in turn resets the flip-flop 102 changing its state so that the Q column lead 124 goes low and the $\overline{Q}$ column lead 130 goes high. The clock pulse then goes high pulling leads 142 and 160 low which causes the flip-flop 102 to hold its state once again.

When the next low clock pulse appears on lead 170, the high $\overline{Q}$ signal will turn on transistor 162 pulling lead 160 low. Lead 142 will be pulled high turning on transistor 146 which sets flip-flop 102. (It should be noted that a low signal on the $\overline{S}$ or $\overline{R}$ leads sets or resets, respectively, the flip-flop). The circuit 100 will continue to change logic state with each low clock pulse and hold its state during each high clock pulse. See the waveforms on leads 170, 142, 160, 108, 110, 124 and 130 in FIG. 4.

As seen from the above discussion, the storage cell portion of the SLA circuit 100 is implemented by cross coupled NAND gates. Four column leads are required for each flip-flop: $\overline{S}$; $\overline{R}$; Q; and $\overline{Q}$. At least six transistors are required to implement the flip-flop when using MOS technology. It is desirable to place as many of the circuits 100 in a regular array in a limited area on a large scale integrated (LSI) or very large scale integrated (VLSI) chip as is possible in a manner as described earlier in the backgrouond of the invention. However, space on the chip must be allocated to accmmodate the four column leads for each flip-flop. In the present invention, a preferred embodiment of which is given in FIG. 2, an improved SLA circuit 200 is provided which reduces the number of column leads required from four to two and which simplifies the design of the storage cell.

Figure 3:
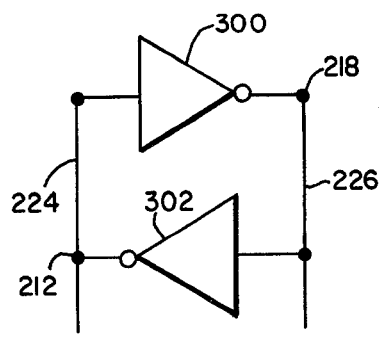
FIG. 3 is a block diagram schematic of a portion of the schematic of FIG. 2.

The improved SLA circuit 200 comprises a storage cell 202 having only two terminals for storing a set or reset state. The cell 200 includes two pairs of MOS transistors 204 and 206. Pair 204 comprises upper transistor 208 and lower transistor 210 connected together at junction 212. Transistor 208 is connected between voltage source $V_{cc}$ and junction 212, while transistor 210 is connected between junction 212 and ground. Similarly, pair 206 comprises upper transistor 216 connected bewteen voltage source $V_{cc}$ and junction 218, and lower transistor 220 connected between junction 218 and ground. The gate of transistor 208 is connected to junction 212 and the gate of transistor 220, while the gate of transistor 216 is connected to junction 218 and the gate of transistor 210. Upper transistors 208 and 216 are depletion type MOS transistors while lower transistors 210 and 220 are enhancement type MOS transistors. Junction 212 is connected to a $\overline{Q/S}$ column lead 224 while junction 218 is connected to a $Q/\overline{R}$ column lead 226. In FIG. 3, the circuit 202 is shown as being equivalent to oppositely directed inverters 300 and 302 with the output of inverter 300 connected to column lead 226 at junction 218, and the output of inverter 302 connected to lead 224 at junction 212. Together, the storage cell 202 and column leads 224 and 226 comprise a column circuit.

Circuit 200 further comprises a first row circuit 232 having an input inverter 234 which includes depletion type MOS transistor 236 connected to enhancement type MOS transistor 238 at junction 240 in a manner similar to the inverter 134 in FIG. 1. The gate of transistor 23 is connected to lead 270. The junction 240 is connected to row lead 242. First row circuit 232 further comprises MOS transistor 244 connected between lead 242 and ground with its gate connected to the column lead 226, and MOS transistor 246 connected between the column lead 224 and ground with its gate connected to the row lead 242.

A second row circuit is also provided comprising inverter 252 with transistors 254 and 256 connected together at junction 258. The gate of transistor 254 is connected to lead 270 while the junction 258 is connected to row lead 260. The second row circuit further comprises MOS transistor 262 connected between the column lead 226 and ground and having its gate connected to row lead 260, and MOS transistor 264 connected between row lead 260 and ground with its gate connected to the column lead 224. The SLA circuit of FIG. 2 shows only two row circuits connected to the column leads 224 and 226. However, in general any number of row circuits can be connected between the column leads in an SLA chip having a plurality of SLA circuits 200. The particular connection of row and column leads described by transistors 244, 246, 262 and 264 are but one example of how the column leads are connected to the row leads. In general, it is not necessary that all of the SLA circuits have their column leads connected to row leads as shown in FIG. 2.

A description of the operation of the above circuit is aided by reference to the waveform illustration of the timing signals of FIG. 5. Initially, it is assumed that the column lead 226 is high and the column lead 224 is low. A series of clock pulses 272 are applied to the inverter circuits 234 and 252 via lead 270. A high clock pulse applied to the gates of transistors 238 and 254 turns the transistors on, pulling the leads 242 and 260 low. This disables transistors 246 and 262 and the storage cell 202 maintains its existing state, that is, the column lead 226 remains high and the column lead 224, remains low during the duration of the high clock pulse. When the clock pulse goes low, transistors 238 and 254 are turned off allowing leads 242 and 260 to be pulled high by action of the depletion type MOS transistors 236 and 256, respectively. However, the signal on the column lead 226 is high which turns on transistor 244 clamping lead 242 low. This turns off transistor 246. However, the signal on the column lead 224 is low disabling transistor 264. Lead 260 is pulled high turning on transistor 262 and pulling the column lead 226 low. When the column lead 226 goes low the gate on transistor 210 goes low turning the transistor off. This allows the column lead 224 to go high through the action of transistor 208 within storage cell 202. The clock pulse then goes high once again pulling leads 242 and 260 low which causes the storage cell 202 to hold its new state.

When the next low clock pulse appears on 270, the high signal will turn on transistor 264 pulling lead 260 low. Lead 242 will be pulled high turning on transistor 246 which sets the column lead 224 low. The low signal on lead 224 turns off transistors 220 within storage cell 202 allowing the column lead 226 to go high through the action of transistor 216. The circuit 200 will continue to change logic state with each low clock pulse and hold its state during each high clock pulse. See the waveforms on leads 270, 242, 260, 226 and 224 in FIG. 5. Note that the waveform on lines 226 and 224 are the same as the waveforms on leads 124 and 130, respectively, in FIG. 4. The Q and $\overline{Q}$ signals are identical for circuits 100 and 200 in response to identical clock signals 170 and 270, respectively. However, the circuit of FIG. 2 requires only two column leads, not four. Similarly, only two oppositely directed inverters are needed to form the storage cell 202 while two cross coupled NAND gates, a more complicated circuit, are required for the flip-flop 102.

While the present invention has been disclosed in connection with the preferred embodiment thereof, it should be understood that there may be other embodiments which fall within the spirit and scope of the invention as defined by the following claims. In particular, the present invention has been described in terms of MOS transistor technology. However, other technologies such as CMOS, bi-polar, GaAs, etc. are equally applicable for carrying out the present invention.

What is claimed is:

1. A storage logic array circuit comprising:
   a column circuit including,
      a storage cell having only two terminals for storing a set state and a reset state, said set state being represented by a signal of a first level at a first of said terminals and a signal of a second level at a second of said terminals, and said reset state being represented by a signal of said second level at said first terminal and a signal of said first level at said second terminal, said storage cell including means responsive to a signal of said second level at said first terminal for switching from said set state to said reset state;
      first and second column leads connected to said first and second terminals, respectively;
   a source providing a continuous reference signal of said second level;
   first and second row conductors;
   a means for simultaneously applying pulses to said first and second row conductors; and
   row circuit means including a first gated transistor connected to said column lead, said first row conductor and said source for connecting said first row conductor to said source when a pulse is applied to said first row conductor and said storage cell is in said set state, and a second gated transistor connected to said second row conductor, said first column lead and said source for connecting said first column lead to said source when a pulse is applied to said second row conductor and said storage cell is in said set state,
   whereby said source is connected to said first terminal to switch said storage cell from said set state to said reset state.

2. A storage logic array as claimed in claim 1 and further comprising:
   a second column circuit, said column circuits being alike;
   an additional row circuit means for said second column circuit, said additional row circuit means including a further gated transistor means connected to one of said first and second row conductors, one of the first and second column leads of said second column circuit, and said source for switching the storage cell in said second column circuit from one of its states to the other.

3. A storage logic array circuit comprising:
   at least one storage cell for storing a set or reset state, said storage cell having only a first and a second terminal;
   first and second column leads connected to said first and second terminals, respectively;
   row circuit means connected to said first and second column leads for enabling transmission of input signals to and output signals from said storage cell;
   said row circuit means comprising a row conductor, first and second gated transistors, and a reference source,
   said first transistor being connected between said first column lead and said reference source with its gate being connected to said row conductor;
   said second transistor being connected between said row conductor and said reference source with its gate being connected to said second column lead; and,
   means for applying pulses to said row conductor.

4. A storage logic array circuit comprising:
   at least one storage cell for storing a set or reset state, said storage cell having only a first and a second terminal;
   first and second column leads connected to said first and second terminals, respectively;
   row circuit means connected to said first and second column leads for enabling transmission of input signals to and output signals from said storage cell;
   said row circuit means comprising first and second row conductors and first, second, third and fourth gated transistors,
   said first and fourth transistors being connected between said first and second column leads, respectively and a reference source,
   said second and third transistors being connected between said first and second row conductors, respectively, and said reference source,
   the gates of said first, second, third and fourth transistors being connected to said first row conductor, said second column lead, said first column lead and said second row conductor, respectively.

5. A storage logic array circuit as claimed in claim 4 and further comprising means for applying pulses to said row conductors.

6. A storage logic array circuit as claimed in claim 5 wherein said means for applying pulses to said row conductors comprises first and second inverter circuits and a source of pulses, said first and second inverter circuits being connected to said source of pulses and responsive to said pulses for simultaneously applying pulses to said first and second row conductors, respectively.

* * * * *

UNITED STATES PATENT AND TRADEMARK OFFICE
CERTIFICATE OF CORRECTION

PATENT NO. : 4,441,168
DATED : Apr. 3, 1984
INVENTOR(S) : Wolodymyr Luciw

It is certified that error appears in the above-identified patent and that said Letters Patent is hereby corrected as shown below:

Col. 6, line 4, after "said" insert -- first --.

Signed and Sealed this

Twelfth Day of November 1985

[SEAL]

Attest:

Attesting Officer

DONALD J. QUIGG

Commissioner of Patents and Trademarks